United States Patent
Ueyama et al.

(10) Patent No.: US 6,990,355 B2
(45) Date of Patent: Jan. 24, 2006

(54) FLEXIBLE PRINTED CIRCUIT BOARD AND FOLDABLE CELL PHONE TERMINAL

(75) Inventors: Tomoki Ueyama, Tottori (JP); Jiro Osaki, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 536 days.

(21) Appl. No.: 10/069,622

(22) PCT Filed: Jun. 4, 2001

(86) PCT No.: PCT/JP01/04710

§ 371 (c)(1),
(2), (4) Date: Feb. 27, 2002

(87) PCT Pub. No.: WO02/03764

PCT Pub. Date: Jan. 10, 2002

(65) Prior Publication Data

US 2002/0135993 A1    Sep. 26, 2002

(30) Foreign Application Priority Data

Jun. 30, 2000  (JP)  ............................. 2000-198502
Oct. 31, 2000  (JP)  ............................. 2000-333024
Oct. 31, 2000  (JP)  ............................. 2000-333026

(51) Int. Cl.
*H04B 15/00*  (2006.01)
*H04B 7/005* (2006.01)
*H04B 7/01*   (2006.01)
*H04B 7/015*  (2006.01)

(52) U.S. Cl. .................. 455/550.1; 455/90.1; 455/90.2; 455/90.3; 455/300; 455/222; 455/899; 379/438; 379/433.13; 379/814; 361/752; 361/749

(58) Field of Classification Search ............... 455/90.2, 455/90.3, 333, 550.1, 300, 90.5, 345, 347, 455/222, 899, 90.1; 379/438, 433, 433.13; 361/814, 752, 749, 818, 254; 349/43, 49, 349/52; 283/814, 749, 752, 254, 818
See application file for complete search history.

(56) References Cited

U.S. PATENT DOCUMENTS 3,979,763 A    9/1976    Mills (Continued)

FOREIGN PATENT DOCUMENTS

JP    S 53-127167    10/1978

(Continued)

*Primary Examiner*—Nick Corsaro
*Assistant Examiner*—Shaima Q. Aminzay
(74) *Attorney, Agent, or Firm*—McDermott Will & Emery LLP (57) ABSTRACT

A flexible printed circuit board has first and second connection portions 18 and 19 where contacts are exposed and first and second path portions 16 and 17 where conductor patterns 11 are arranged that connect the contacts 11*a* and 11*b* of the first and second connection portions 18 and 19 together. The first and second path portions 16 and 17 are formed so as to have substantially symmetrical shapes with each other about a predetermined straight line, and the flexible printed circuit board is folded up along the straight line C1 and C2. Alternatively, a flexible printed circuit board has a conductor pattern 11 formed between first and second insulating sheets 12 and 13, and has a shielding conductor 14 fixed to the second insulating sheet 13. The flexible printed circuit board is folded up with the second insulating sheet 13 outside so that the conductor pattern 11 is enclosed inside the shielding conductor 14.

4 Claims, 7 Drawing Sheets

U.S. PATENT DOCUMENTS

| | | | |
|---|---|---|---|
| 5,027,394 A | | 6/1991 | Ono et al. |
| 5,117,073 A | * | 5/1992 | Mischenko ................ 200/61.7 |
| 5,375,321 A | | 12/1994 | Rohatgi et al. |
| 5,639,994 A | | 6/1997 | Tanaka |
| 5,799,079 A | * | 8/1998 | Inoue .................... 379/433.13 |
| 5,832,080 A | * | 11/1998 | Beutler et al. ......... 379/433.13 |
| 6,352,434 B1 | * | 3/2002 | Emmert ....................... 439/65 |
| 6,421,531 B1 | * | 7/2002 | Dehan et al. .............. 455/90.1 |

FOREIGN PATENT DOCUMENTS

| | | |
|---|---|---|
| JP | S 55-74090 | 5/1980 |
| JP | 64-089845 | 4/1989 |
| JP | 6-283829 | 10/1994 |
| JP | 8-148788 | 6/1996 |
| JP | 09-082439 | 3/1997 |
| JP | 9-199811 | 7/1997 |

* cited by examiner

FLEXIBLE PRINTED CIRCUIT BOARD AND FOLDABLE CELL PHONE TERMINAL

TECHNICAL FIELD

The present invention relates to a flexible printed circuit board of which a portion is bent, and relates also to a folding-type cellular telephone terminal having a flexible printed circuit board of which a portion is bent.

BACKGROUND ART

A folding-type (collapsible) cellular telephone terminal, such as a folding-type cellular phone or a folding-type PHS (personal handyphone system) phone, has two body casings coupled together with a hinge portion. Printed circuit boards having electronic components mounted thereon are housed inside the individual body casings, and are connected together with a flexible printed circuit board. To make the folding-type cellular telephone terminal compact, the flexible printed circuit board is required to have a sufficiently small width. Moreover, as disclosed in Japanese Patent Application Laid-Open No. H1-89845, to prevent damage, such as breakage of conductors, resulting from the folding and unfolding of the body casings, the flexible printed circuit board arranged in the hinge portion is wound in a helical shape. Thus, the flexible printed circuit board is required to have a smaller width.

However, as folding-type cellular telephone terminals are furnished with increasingly advanced functions, the number of conductors formed as a conductor pattern on the flexible printed circuit board tends to increase. This makes it increasingly difficult to arrange the flexible printed circuit board in the body casings. This problem can be overcome by the use of a double-sided flexible printed circuit board having conductor patterns formed on both sides. However, a double-sided flexible printed circuit board is thicker than a single-sided one, and therefore the conductor pattern on the outer side receives a stronger tensile force when the flexible printed circuit board is bent. This leads to lower durability against the folding and unfolding of the body casing.

Moreover, a device, such as a folding-type cellular telephone terminal, that employs digital circuits and thus uses a clock pulse, tends to emit pulse noise, making the device a noise source. Noise is propagated either by being radiated through the air or by being conducted by a power or signal line. Where wiring is achieved by the use of a flexible printed circuit board, noise is propagated, by being conducted by the flexible printed circuit board, to other printed circuit boards having electronic components mounted thereon. Moreover, the flexible printed circuit board itself may act as an antenna, receiving noise being radiated through the air and propagating it to the other circuit boards. Such noise can be suppressed by shielding the flexible printed circuit board, but it is not easy to shield it, since it is bent frequently.

DISCLOSURE OF THE INVENTION

An object of the present invention is to provide a flexible printed circuit board that can be arranged easily in a narrow width, and to provide a folding-type cellular telephone terminal employing such a flexible printed circuit board. Another object of the present invention is to provide a flexible printed circuit board that can be shielded easily, and to provide a folding-type cellular telephone terminal employing such a flexible printed circuit board.

To achieve the above objects, according to one aspect of the present invention, a flexible printed circuit board is provided with first and second insulating sheets, a conductor pattern formed between the first and second insulating sheets, and a shielding conductor fixed to the second insulating sheet. Here, the flexible printed circuit board is folded up with the second insulating sheet outside so that the conductor pattern is enclosed inside the shielding conductor.

According to another aspect of the present invention, a flexible printed circuit board is provided with first and second connection portions where contacts are exposed and first and second path portions where conductor patterns are arranged that connect the contacts of the first and second connection portions together. Here, the first and second path portions are formed so as to have substantially symmetrical shapes with each other about a predetermined straight line, and the flexible printed circuit board is folded up along the straight line.

According to another aspect of the present invention, a folding-type cellular telephone terminal is provided with: first and second body casings; a hinge portion that pivotably couples the first and second body casings together; and a flexible printed circuit board provided with first and second insulating sheets, a conductor pattern formed between the first and second insulating sheets, and a shielding conductor fixed to the second insulating sheet. The flexible printed circuit board is arranged so as to bridge between the first and second body casings. Here, the flexible printed circuit board is folded up with the second insulating sheet outside so that the conductor pattern is enclosed inside the shielding conductor.

According to another aspect of the present invention, a folding-type cellular telephone terminal is provided with: first and second body casings; a hinge portion that pivotably couples the first and second body casings together; and a flexible printed circuit board provided with first and second connection portions where contacts are exposed and first and second path portions where conductor patterns are arranged that connect the contacts of the first and second connection portions together. The first and second path portions are formed so as to have substantially symmetrical shapes with each other about a predetermined straight line, and the flexible printed circuit board is folded up along the straight line. Here, the overlapping portion of the flexible printed circuit board which is formed as a result of the flexible printed circuit board being folded up is arranged so as to form a helical shape in the hinge portion.

According to another aspect of the present invention, in the folding-type cellular telephone terminal structured as described above, the straight line along which the flexible printed circuit board is folded up is arranged outside the hinge portion, and displacement preventing means for preventing displacement along the straight line is provided only at one end of the first and second path portions.

BEST MODE FOR CARRYING OUT THE INVENTION

Figure 1:
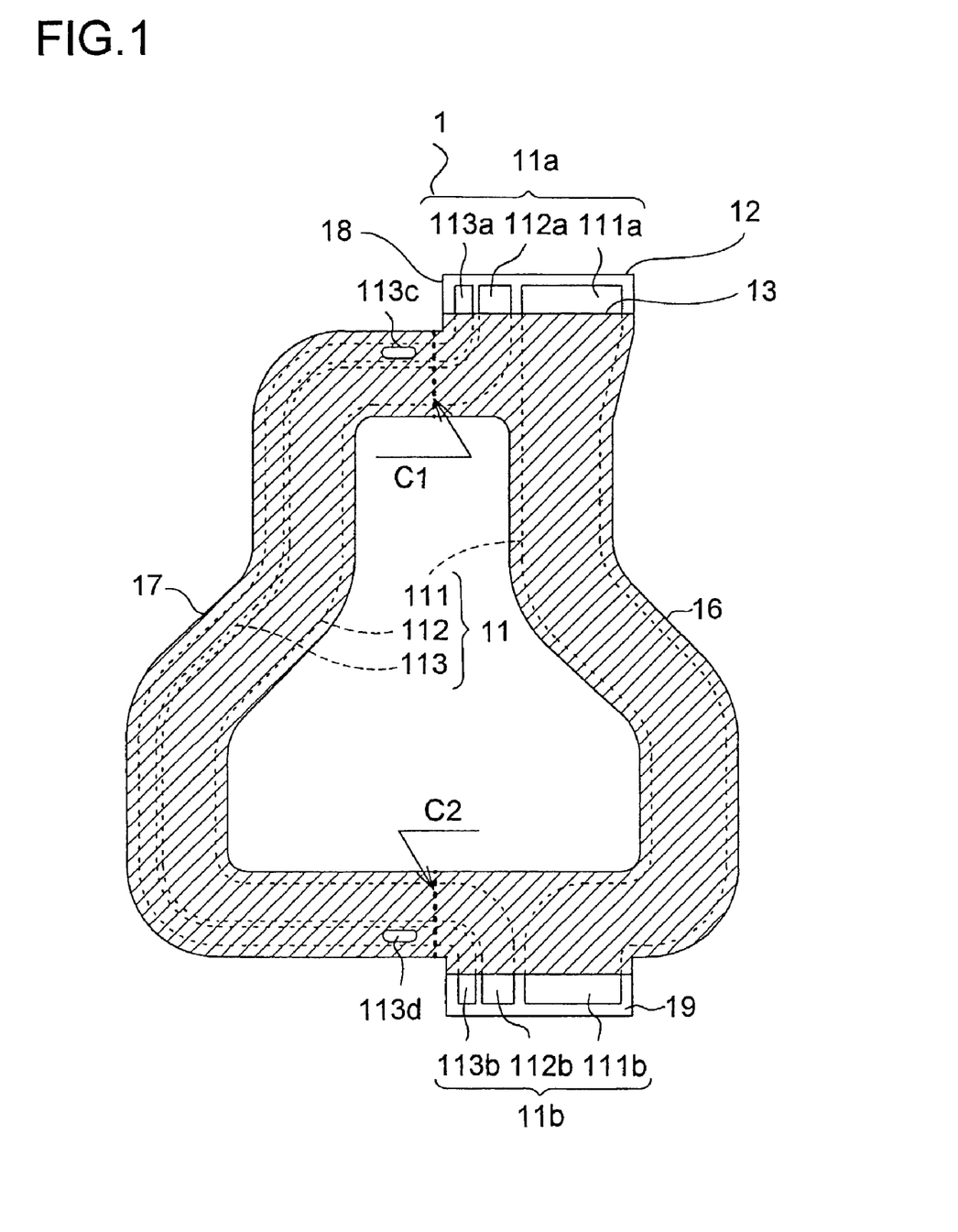
FIG. 1 is a plan view of a flexible printed circuit board embodying the invention, before being shielded.
Figure 2:
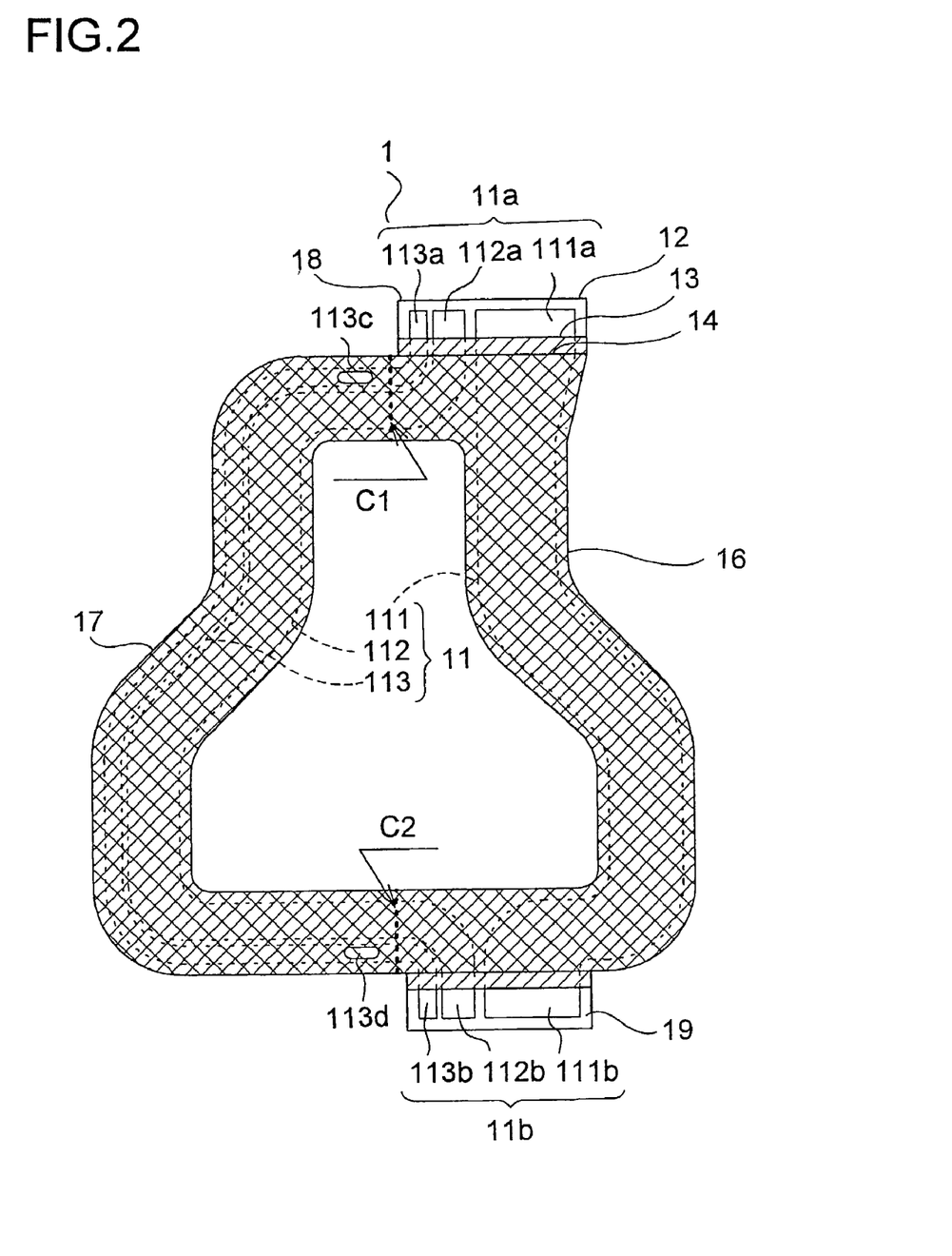
FIG. 2 is a plan view of the flexible printed circuit board embodying the invention, after being shielded.

Hereinafter, an embodiment of the present invention will be described with reference to the drawings. FIGS. 1 and 2 are plan views of a flexible printed circuit board embodying the invention, respectively before and after being shielded. As will be described in detail later, the flexible printed circuit board of this embodiment is incorporated in a folding-type cellular telephone terminal (see FIG. 7),.

The flexible printed circuit board 1 has a first and a second connection portion 18 and 19 where contact portions 11a and 11b of conductor patterns 11 are exposed. The conductor patterns 11 include a first and a second pattern 111 and 112 for signal transmission and a third pattern 113 for grounding. The first and second connection portions 18 and 19 are connected together by a first path portion 16 where the first pattern 111 is arranged and a second path potion 17 that branches off the first path portion 18 and where the second and third patterns 111 and 112 are arranged.

The conductor pattern 11 is vacuum-deposited on a first insulating sheet 12, and on the conductor pattern 11 is laid a second insulating sheet 13 (indicated by hatches ascending rightward in the figures). The first and second insulating sheets 12 and 13 are formed of polyimide or polyester about 12.5 μm (½ microinches) thick. The conductor pattern 11 is formed of silver or the like about 40 μm thick.

The second insulating sheet 13 is laid over the conductor pattern 11 in such a way that individual contact portions 111a, 112a, 113a, 111b, 112b, and 113b of the conductor pattern 11 are exposed. Grounding portions 113c and 113d of the third pattern 113 are also exposed.

On the surface of the second insulating sheet 13, a shielding conductor 14 (indicated by hatches descending rightward in the figures) formed of aluminum or the like is vacuum-deposited. The grounding portions 113c and 113d conduct to the shielding conductor 14, which in turn is grounded by way of the third pattern 113. As will be described later, substantially central portions of the first and second path portions 16 and 17, as viewed vertically in the figures, are arranged so as to form a helical shape. For this reason, the grounding portions 113c and 113d are formed near the first and second connection portions 18 and 19, where the bending of the first and second path portions 16 and 17 has less effect.

The external shapes of the first and second path portions 16 and 17 are so designed as to be symmetrical with each other about folding lines C1 and C2 that lie on a straight line. When the flexible printed circuit board 1 is folded up along the folding lines C1 and C2, the external shapes of the first and second path portions 16 and 17 overlap with each other substantially completely. The folding lines C1 and C2 are located away from the first and second connection portions 18 and 19. This permits the first and second connection portions 18 and 19 to be connected to connectors 2a and 3a (see FIG. 6) without being bent.

Figure 3:
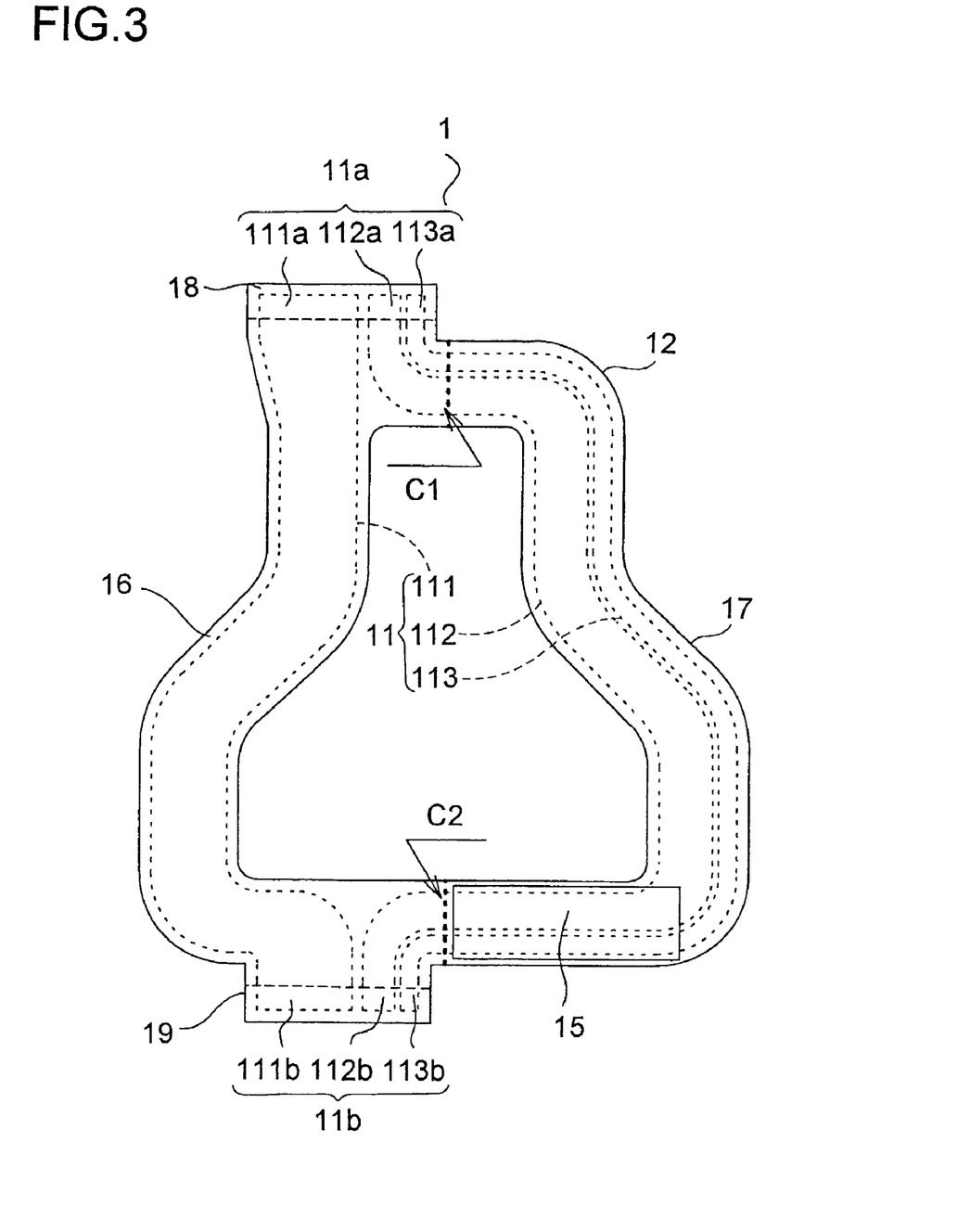
FIG. 3 is a plan view of the flexible printed circuit board embodying the invention, showing its back side.

FIG. 3 is a plan view showing the back side of the flexible printed circuit board 1. On the back surface of the second path portion 17, near the second connection portion 19, an adhesive member (displacement preventing means) formed of double-sided adhesive tape or the like is affixed to the first insulating sheets.

Figure 4:
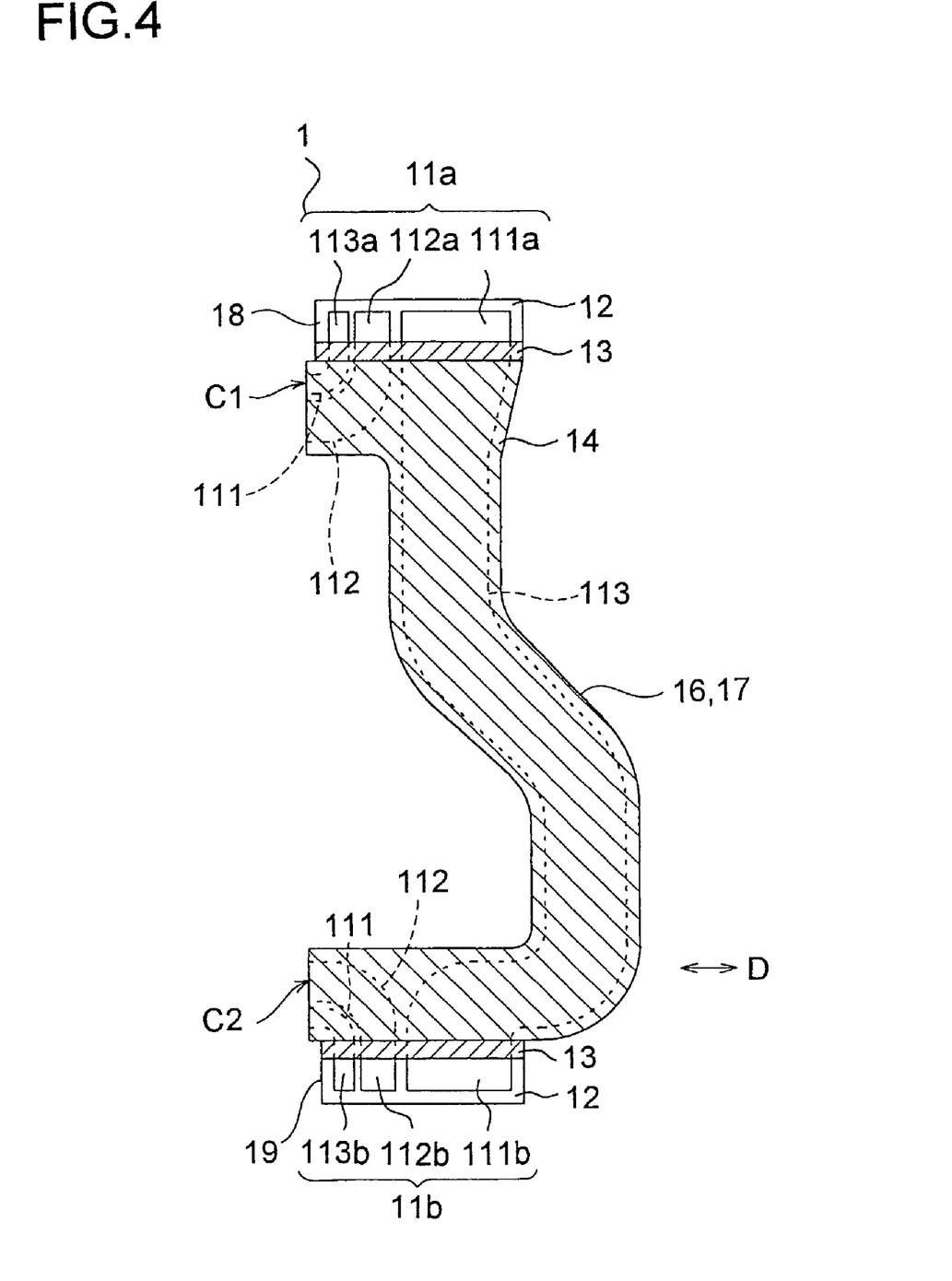
FIG. 4 is a plan view of the flexible printed circuit board embodying the invention, in its folded state.
Figure 5:
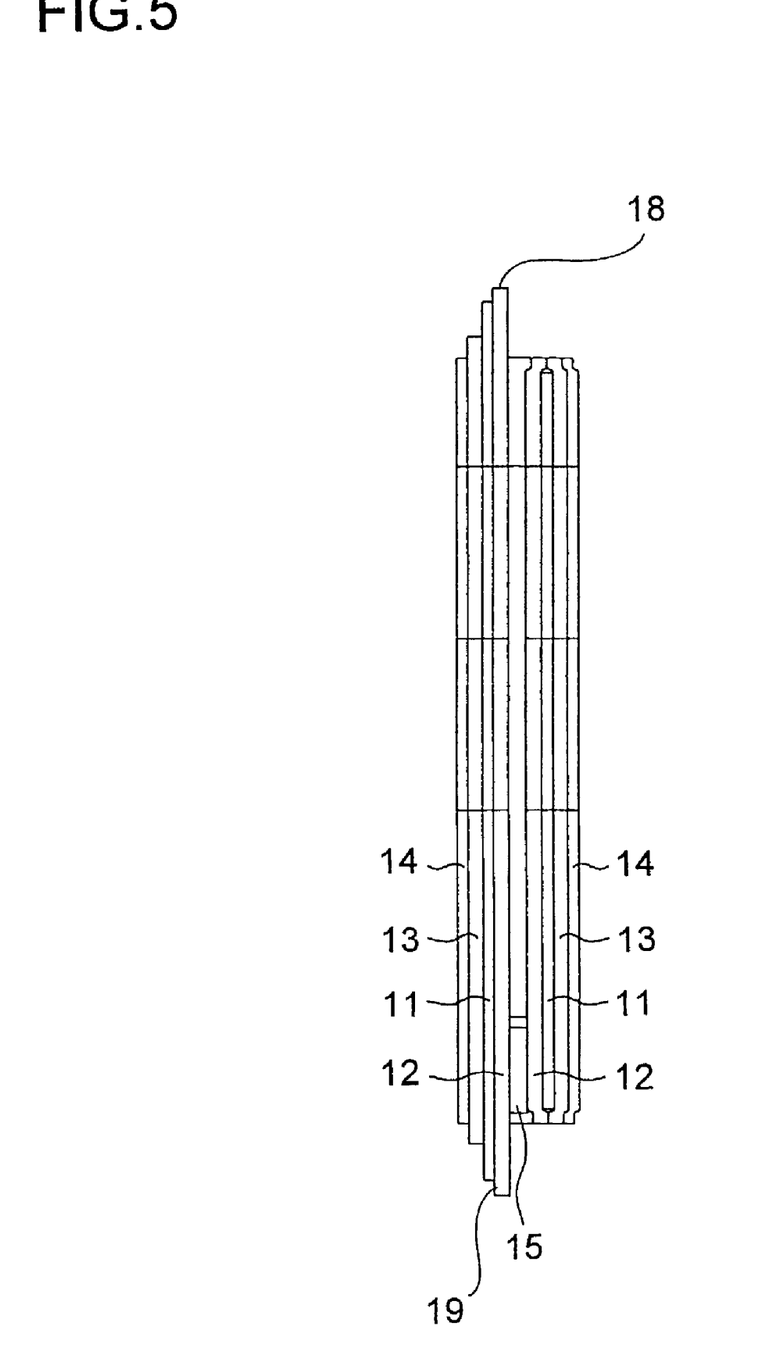
FIG. 5 is a side view of the flexible printed circuit board embodying the invention, in its folded state.

FIGS. 4 and 5 are a plan view and a side view, respectively, of the flexible printed circuit board 1 in its state folded up along the folding lines C1 and C2. The flexible printed circuit board 1 is folded up along the folding lines C1 and C2 with the adhesive member 15 (see FIG. 3) inside and the shielding conductor 14 (indicated by the rightward descending hatches) outside. As a result, portions of the first and second path portions 16 and 17 near the second connection portion 19 are bonded together, which prevents the first and second path portions 16 and 17, now facing each other, from being displaced in the direction (indicated by arrows D) perpendicular to the folding lines C1 and C2, and which also prevents the flexible printed circuit board 1, now folded up, from unfolding.

Moreover, as a result of the flexible printed circuit board 1 being folded up, the first and second path portions 16 and 17 overlap with each other substantially completely, and thus the first pattern 111 now faces the second and the third patterns 112 and 113. That is, the first, second, and third patterns 111, 112, and 113 are now enclosed in the shielding conductor 14 arranged outside.

Thus, simply by folding up the flexible printed circuit board 1, it is possible to enclose the conductor pattern 11 in the shielding conductor 14 and thereby achieve the shielding of the conductor pattern 11 easily, without vacuum-depositing a shielding conductor on the first insulating sheet 12. In this way, it is possible to reduce the noise propagated by way of the flexible printed circuit board 1. Moreover, it is possible to make the flexible printed circuit board 1 thinner and thereby minimize the lowering of its durability that accompanies the folding and unfolding of a folding-type cellular telephone terminal 10 (see FIG. 7).

Here, when the flexible printed circuit board 1 is folded up, the conductor pattern 11 overlaps with itself However, the conductor pattern 11 does not necessarily have to overlap with itself, as long as the conductor pattern 11 is enclosed in the shielding conductor 14 when the insulating sheet 12 having the shielding conductor 14 fixed thereto is folded up. The insulating sheet 13 is formed so as to cover a wider area than where the first and second path portions 16 and 17, facing each other, overlap with each other. This prevents short-circuiting between the first pattern 111 and the second and third patterns 112 and 113.

Figure 6:
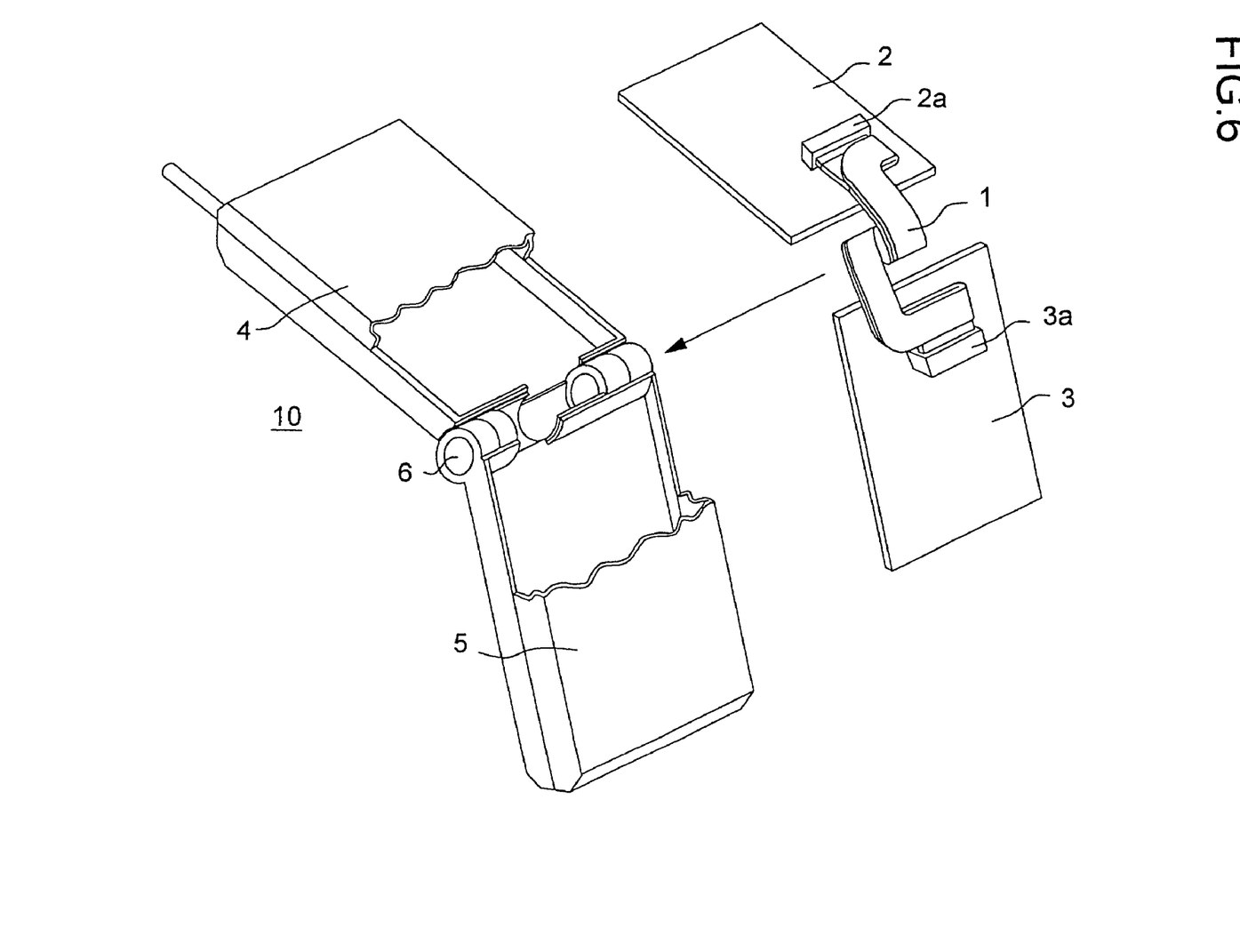
FIG. 6 is a partially cutaway perspective view of the flexible printed circuit board embodying the invention, in its state before being incorporated into a cellular telephone terminal.
Figure 7:
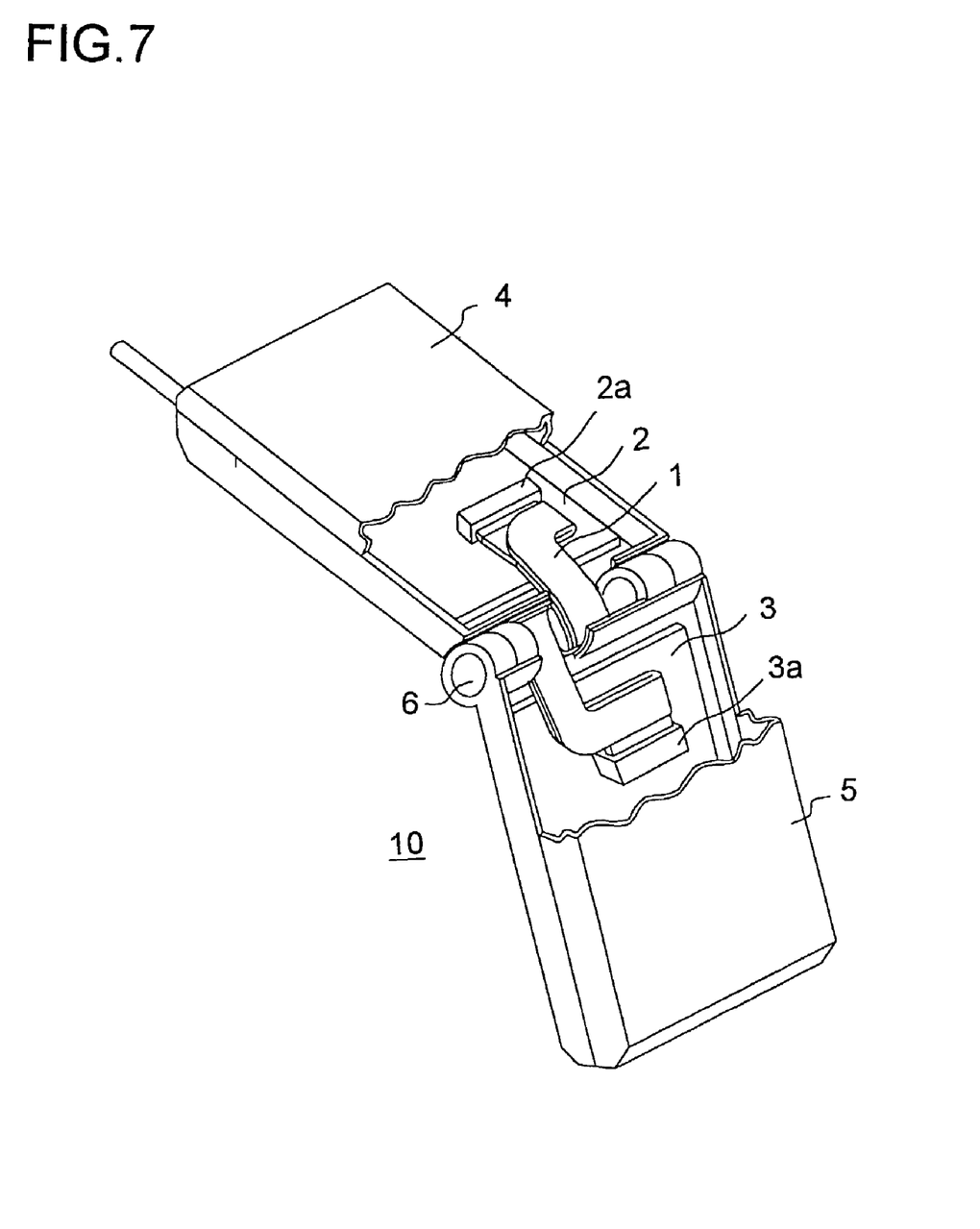
FIG. 7 is a partially cutaway perspective view of the cellular telephone terminal having the flexible printed circuit board embodying the invention incorporated therein.

FIG. 6 is a partially cutaway perspective view of the flexible printed circuit board 1, in its state before being incorporated into a folding-type cellular telephone terminal. FIG. 7 is a partially cutaway perspective view of the folding-type cellular telephone terminal having the flexible printed circuit board 1 incorporated therein.

The folding-type cellular telephone terminal 10 in which the flexible printed circuit board 1 is incorporated is provided with an ear-piece portion (first body casing) 4, a mouthpiece portion (second body casing) 5, and a hinge portion 6 that pivotably couples the ear-piece portion 4 and the mouth-piece portion 5 together. Inside the ear-piece and mouthpiece portions 4 and 5 are respectively arranged printed circuit boards 2 and 3 having electronic components mounted thereon.

The flexible printed circuit board 1 is connected to a connector 2a on the printed circuit board 2 and to a connector 3a on the printed circuit board 3, with a central portion of the flexible printed circuit board 1 bent one turn so as to form a helical shape. As shown in FIG. 7, the flexible printed circuit board 1 is housed in the folding-type cellular telephone terminal 10 with the helical portion (bent portion) of the former placed inside the hinge portion 6 of the latter. Bending the flexible printed circuit board 1 one turn inside the hinge portion 6 helps enhance the durability of the folding-type cellular telephone terminal 10 against its folding and unfolding.

Moreover, since the flexible printed circuit board 1 is so designed as to be substantially symmetrical about a line, when it is folded up, the first and second path portions 16 and 17 overlap with each other substantially completely. This helps reduce the width of the central portion, as viewed vertically in FIG. 4 described earlier, of the flexible printed circuit board 1 after being folded up. This makes the central portion of the flexible printed circuit board 1, even though it is formed into a helical shape, easy to put in the hinge portion 6. Thus, even if the flexible printed circuit board 1 have more conductor patterns laid thereon, it can easily be housed in the folding-type cellular telephone terminal 10.

When the folding-type cellular telephone terminal 10 is unfolded, the difference between the internal and external diameters of the helical portion of the flexible printed circuit board 1 becomes greater; when the folding-type cellular telephone terminal 10 is folded up, that difference becomes smaller. In the flexible printed circuit board 1 of this embodiment, the folding lines C1 and C2 (see FIG. 2) are located outside the hinge portion 6 so as not to run through the helical portion inside the hinge portion 6. This permits the outside and inside of the flexible printed circuit board 1 to move relative to each other in the helical portion thereof placed inside the hinge portion 6.

Moreover, since the adhesive member 15 is provided only near the second connection portion 19, as the folding-type cellular telephone terminal 10 is unfolded and folded, the second path portion 17 moves relatively toward the first connection portion. This makes it possible to absorb the tensile force resulting from the difference between the external and internal diameters of the helical portion when the folding-type cellular telephone terminal is unfolded and folded. In this way, it is possible to prevent damage to the flexible printed circuit board 1 resulting from a tensile force.

The flexible printed circuit board 1 of this embodiment has the conductor 11 pattern formed on one side only. However, it is also possible to use a flexible printed circuit board having conductor patterns formed on both sides.

INDUSTRIAL APPLICABILITY

As described above, according to the present invention, a flexible printed circuit board has a conductor pattern laid between a first and a second insulating sheet, and is folded up with the second insulating sheet, having a shielding conductor fixed thereto, outside so that the conductor pattern is enclosed in the shielding conductor. In this way, it is possible to enclose the conductor pattern in the shielding conductor and thereby achieve the shielding of the conductor pattern easily without vacuum-depositing a shielding conductor on the first insulating sheet. This helps reduce the noise propagated by way of the flexible printed circuit board.

Moreover, according to the present invention, a flexible printed circuit board has a first and a second path portions thereof so designed as to have substantially symmetrical external shapes about a predetermined straight line, and is folded up along this straight line. This permits the first and second path portions to overlap with each other when the flexible printed circuit board is folded up, and thus helps reduce the width of part of the flexible printed circuit board after being folded up. Thus, even when a flexible printed circuit board having more conductor patterns is bent so as to form a helical shape, the helical portion can easily be put in the hinge portion of a folding-type cellular telephone terminal.

Moreover, according to the present invention, a flexible printed circuit board is formed into a helical shape in a hinge portion, a folding line is located outside the hinge portion, and a displacement preventing means for preventing displacement in the direction perpendicular to the folding line is provided only at one end of a first and a second path portion. This permits the outside and inside of the flexible printed circuit board to move relative to each other inside the hinge portion, and also permits one of the first and second path portions to move relatively at the other end when a folding-type cellular telephone terminal is unfolded and folded. This makes it possible to absorb the tensile force resulting from the difference between the external and internal diameters of the helical portion when the folding-type cellular telephone terminal is unfolded and folded. In this way, it is possible to prevent damage to the flexible printed circuit board resulting from a tensile force.

The invention claimed is:

1. A flexible printed circuit board comprising first and second insulating sheets, a conductor pattern formed between the first and second insulating sheets, and a shielding conductor fixed to the second insulating sheet, wherein the flexible printed circuit board is folded up with the second insulating sheet outside so that the conductor pattern is enclosed inside the shielding conductor.

2. A folding-type cellular telephone terminal comprising:
   first and second body casings;
   a hinge portion that pivotably couples the first and second body casings together; and
   a flexible printed circuit board comprising first and second insulating sheets, a conductor pattern formed between the first and second insulating sheets, and a shielding conductor fixed to the second insulating sheet, the flexible printed circuit board being arranged so as to bridge between the first and second body casings,
   wherein the flexible printed circuit board is folded up with the second insulating sheet outside so that the conductor pattern is enclosed inside the shielding conductor.

3. A folding-type cellular telephone terminal comprising:
   first and second body casings;
   a hinge portion that pivotably couples the first and second body casings together; and
   a flexible printed circuit board comprising first and second connection portions where contacts are exposed and first and second path portions where conductor patterns are arranged that connect the contacts of the first and second connection portions together, the first and second path portions being formed so as to have substantially symmetrical shapes with each other about a predetermined straight line, the flexible printed circuit board being folded up along the straight line,
   wherein an overlapping portion of the flexible printed circuit board which is formed as a result of the flexible printed circuit board being folded up is arranged so as to form a helical shape in the hinge portion.

4. A folding-type cellular telephone terminal as claimed in claim 3,
   wherein the straight line along which the flexible printed circuit board is folded up is arranged outside the hinge portion, and displacement preventing means for preventing displacement along the straight line is provided only at one end of the first and second path portions.

* * * * *